United States Patent
Chang

(10) Patent No.: US 9,345,086 B2
(45) Date of Patent: May 17, 2016

(54) LIGHTING CIRCUIT

(75) Inventor: Richard Rugin Chang, Shanghai (CN)

(73) Assignee: Enraytek Optoelectronics Co., Ltd., Shanghai (CN)

( * ) Notice: Subject to any disclaimer, the term of this patent is extended or adjusted under 35 U.S.C. 154(b) by 288 days.

(21) Appl. No.: 13/881,722

(22) PCT Filed: Feb. 10, 2011

(86) PCT No.: PCT/CN2011/070902
§ 371 (c)(1),
(2), (4) Date: Jul. 12, 2013

(87) PCT Pub. No.: WO2012/055187
PCT Pub. Date: May 3, 2012

(65) Prior Publication Data
US 2013/0285550 A1    Oct. 31, 2013

(30) Foreign Application Priority Data
Oct. 28, 2010    (CN) .......................... 2010 1 0524402

(51) Int. Cl.
*H05B 37/02*    (2006.01)
*H05B 33/08*    (2006.01)
(Continued)

(52) U.S. Cl.
CPC ............... *H05B 33/083* (2013.01); *H02M 7/06* (2013.01); *H05B 33/0809* (2013.01); *H05B 37/02* (2013.01); *H01L 25/0753* (2013.01); *H01L 2924/0002* (2013.01)

(58) Field of Classification Search
CPC ....... F21V 23/02; F21V 29/00; F21Y 101/02; H01J 1/52; H01J 2229/0015; H01J 29/003; H01J 5/02; H01L 25/0753; H01L 2924/0002; H01T 13/05; H02M 7/06; H05B 33/0809; H05B 33/083; H05B 37/02

USPC .......................................................... 315/85
See application file for complete search history.

(56) References Cited

U.S. PATENT DOCUMENTS 4,769,596 A * 9/1988 Faucett .............. G01R 31/2805
324/537
8,324,840 B2 * 12/2012 Shteynberg .......... H05B 33/083
315/185 R (Continued)

FOREIGN PATENT DOCUMENTS

CN    1728479 A    2/2006
CN    1777342 A    5/2006
(Continued)

OTHER PUBLICATIONS

Translation of Chinese Patent Application CN 101210667 to Zhang, CN101210667 Zhang trans.pdf, 5 pages.*
(Continued)

*Primary Examiner* — John Poos
*Assistant Examiner* — David Mattison
(74) *Attorney, Agent, or Firm* — Faegre Baker Daniels LLP

(57) ABSTRACT

A lighting circuit comprises a first rectifying diode (D1), a second rectifying diode (D2), a third rectifying diode (D3), a fourth rectifying diode (D4), a first group of LEDs (LED11, . . . , LED1n), a second group of LEDs (LED21, . . . , LED2n), a third group of LEDs (LED31, . . . , LED3n), and a fourth group of LEDs (LED41, . . . , LED4n). The first group of LEDs (LED11, . . . , LED1n) is connected between the anode and the cathode of the first rectifying diode (D1); the second group of LEDs (LED21, . . . , LED2n) is connected between the anode and the cathode of the second rectifying diode (D2); the third group of LEDs (LED31, . . . , LED3n) is connected between the anode and the cathode of the third rectifying diode (D3); the fourth group of LEDs (LED41, . . . , LED4n) is connected between the anode and the cathode of the fourth rectifying diode (D4).

9 Claims, 1 Drawing Sheet

(51) Int. Cl.
*H02M 7/06* (2006.01)
*H01L 25/075* (2006.01)

(56) References Cited

U.S. PATENT DOCUMENTS

| | | | | |
|---|---|---|---|---|
| 2006/0023762 A1* | 2/2006 | Nishida | ............... | H01L 25/167 |
| | | | | 372/43.01 |
| 2007/0194325 A1* | 8/2007 | Sung | ............... | H01L 33/0079 |
| | | | | 257/79 |
| 2010/0109558 A1 | 5/2010 | Chew | | |

FOREIGN PATENT DOCUMENTS

| CN | 2792081 Y | 6/2006 |
|---|---|---|
| CN | 201034265 Y | 3/2008 |
| CN | 101210667 A | 7/2008 |
| CN | 201129690 Y | 10/2008 |
| CN | 101442852 A | 5/2009 |
| CN | 201262375 Y | 6/2009 |
| CN | 201616930 U | 1/2010 |
| CN | 201479415 U | 5/2010 |

OTHER PUBLICATIONS

International Search Report and Written Opinion issued by the State Intellectual Property Office, the P.R. China (in Chinese language) dated Jul. 22, 2011, for related International Application No. PCT/CN2011/070902; 9 pages.

English translation of the International Search Report issued by the State Intellectual Property Office, the P.R. China, dated Jul. 22, 2011, for related International Application No. PCT/CN2011/070902; 5 pages.

* cited by examiner

LIGHTING CIRCUIT

CROSS REFERENCE TO RELATED APPLICATIONS

The present application is a Section 371 National Stage Application of International Application No. PCT/CN2011/070902, filed on Feb. 10, 2011, which claims priority to Chinese patent application No. 201010524402.3, filed on Oct. 28, 2010, and entitled "Lighting Circuit", the entire disclosure of which is incorporated herein by reference.

TECHNICAL FIELD

The present disclosure generally relates to circuit design field, and more particularly, to a lighting circuit.

BACKGROUND

Light Emitting Diode (LED) is a solid semiconductor luminous device, which uses a solid semiconductor chip as a light emitting material and releases surplus energy by means of recombination of charge carriers, thus leading to photon emission and directly generating light like red, yellow, blue, green, cyan, orange and purple light.

Today, as energy shortage is increasingly serious, some developed areas, such as Japan, United States and Europe, are making efforts to use LEDs for public lighting in urban areas. Meanwhile, our government also encourages the development in LED and semiconductor illuminating industry. Therefore, the semiconductor lighting industry is likely to have a bright prospect in the international and domestic markets.

With the development of LED technology, LED lighting devices have been used in various applications. The LED lighting devices may be classified in different types, such as, ordinary LED, digit tube LED, high-power LED, and so on. Generally, the high-power LED may include a plurality of LEDs connected in-series. An alternating current from an AC power goes through a rectifier circuit, which is then supplied to the plurality of LEDs, so that the plurality of LEDs can emit light.

However, the conventional LED circuit needs a special rectifier circuit to transform an alternating current into a direct current which can be supplied to the LED circuit. In addition, in the conventional art, the LED circuit can not work even if only one LED is damaged.

SUMMARY

The present disclosure provides a lighting circuit in which there is no need for a rectifier circuit to transform an alternating current into a direct current, and there are still some LEDs can emit light even if one or more LEDs are damaged.

Embodiments of the present disclosure provide a lighting circuit. The lighting circuit may include:

a first rectifier diode, a second rectifier diode, a third rectifier diode and a fourth rectifier diode, where a positive pole of the first rectifier diode is connected to a negative pole of the second rectifier diode, a negative pole of the first rectifier diode is connected to a negative pole of the third rectifier diode, a positive pole of the third rectifier diode is connected to a negative pole of the fourth rectifier diode, and a positive pole of the fourth rectifier diode is connected to a positive pole of the second rectifier diode;

a first set of LEDs, a second set of LEDs, a third set of LEDs and a fourth set of LEDs, where a plurality of LEDs of the first set are connected in series and are connected to the first rectifier diode between its positive and negative poles, a plurality of LEDs of the second set are connected in series and are connected to the second rectifier diode between its positive and negative poles, a plurality of LEDs of the third set are connected in series and are connected to the third rectifier diode between its positive and negative poles, and a plurality of LEDs of the fourth set are connected in series and are connected to the fourth rectifier diode between its positive and negative poles;

in the positive half-wave period of an AC power, the first rectifier diode and the third set of LEDs in a same branch are powered on and the third set of LEDs emit light, and the fourth rectifier diode and the second set of LEDs in a same branch are powered on and the second set of LEDs emit light; and in the negative half-wave period of the AC power, the third rectifier diode and the first set of LEDs in a same branch are powered on and the first set of LEDs emit light, and the second rectifier diode and the fourth set of LEDs in a same branch are powered on and the fourth set of LEDs emit light.

In some embodiments, the lighting circuit may further include a transformer, where input terminals of the transformer may be connected to two poles of the AC power, output terminals of the transformer may be respectively connected to the positive poles of the first rectifier diode and the third rectifier diode.

In some embodiments, the LED may be selected from a LED emitting blue light, a LED emitting red light, a LED emitting green light and a LED emitting white light.

In some embodiments, the first rectifier diode, the second rectifier diode, the third rectifier diode and the fourth rectifier diode may be integrated on a first chip layer, the plurality of LEDs connected in series may be integrated on a second chip layer, and the second chip layer may be formed on the first chip layer.

In some embodiments, the lighting circuit may further include an electrostatic protection circuit which is connected to the first, second, third and fourth sets of LEDs.

In some embodiments, the electrostatic protection circuit may be integrated on the same layer as the first rectifier diode, the second rectifier diode, the third rectifier diode and the fourth rectifier diode.

In some embodiments, the LED may be a flip-chip LED or a non-flip-chip LED.

In some embodiments, the lighting circuit may further include a substrate, where the first chip layer may be formed on the substrate.

In some embodiments, the lighting circuit may further include a cooling layer, where the first chip layer may be formed on the cooling layer, and the cooling layer may be formed on a substrate.

In some embodiments, the substrate may be a silicon substrate.

Compared with the prior art, this disclosure has the following advantages:

According to embodiments of the present disclosure, the first set of LEDs are connected to the first rectifier diode between its positive and negative poles, the second set of LEDs are connected to the second rectifier diode between its positive and negative poles, the third set of LEDs are connected to the third rectifier diode between its positive and negative poles, and the fourth set of LEDs are connected to the fourth rectifier diode between its positive and negative poles. In the positive half-wave period of the AC power, the first rectifier diode and the third set of LEDs in a same branch are powered on and the third set of LEDs emit light, and the fourth rectifier diode and the second set of LEDs in a same branch are powered on and the second set of LEDs emit light. In the negative half-wave period of the AC power, the third rectifier diode and the first set of LEDs in a same branch are powered on and the first set of LEDs emit light, and the second rectifier diode and the fourth set of LEDs in a same branch are powered on and the fourth set of LEDs emit light. Accordingly, the lighting circuit can emit light without a rectifier circuit to transform an alternating current into a direct current. As there is no rectifier circuit, it is power saving for the lighting circuit.

Even if a LED is damaged causing the corresponding set of LEDs can not work, the other sets of LEDs can still work. Thus the lifetime of the lighting circuit can be extended. The second and third sets of LEDs work in the positive half-wave period of the AC power, not in the negative half-wave period of the AC power, and the first and fourth sets of LEDs work in the negative half-wave period of the AC power, not in the positive half-wave period of the AC power. That is, during a duty cycle of the AC power, each LED works in a half-wave period and does not work in another half-wave period. Thus, working time of each LED can be reduced during the duty cycle of the AC power. As a result, rates of usage and risk of damage of each LED can be reduced, and lifetime of the lighting circuit can be extended.

DETAILED DESCRIPTION

According to the present disclosure, a lighting circuit may include four sets of LEDs. Each set of LEDs are connected in-series. By connecting a first set of LEDs to a first rectifier diode between its positive and negative poles, connecting a second set of LEDs to a second rectifier diode between its positive and negative poles, connecting a third set of LEDs to a third rectifier diode between its positive and negative poles, and connecting a fourth set of LEDs to a fourth rectifier diode between its positive and negative poles, the lighting circuit can emit light without a special rectifier circuit to convert an alternating current into a direct current. In addition, the lighting circuit according to the present disclosure is power saving because it has no rectifier circuit. In addition, the second and third sets of LEDs work in the positive half-wave periods of the AC power, and the first and fourth sets of LEDs work in the negative half-wave periods of the AC power, thereby extending lifetime of the lighting circuit.

In order to clarify the objects, characteristics and advantages of the disclosure, the embodiments of the present disclosure will be described in detail in conjunction with the accompanying drawings.

Figure 1:
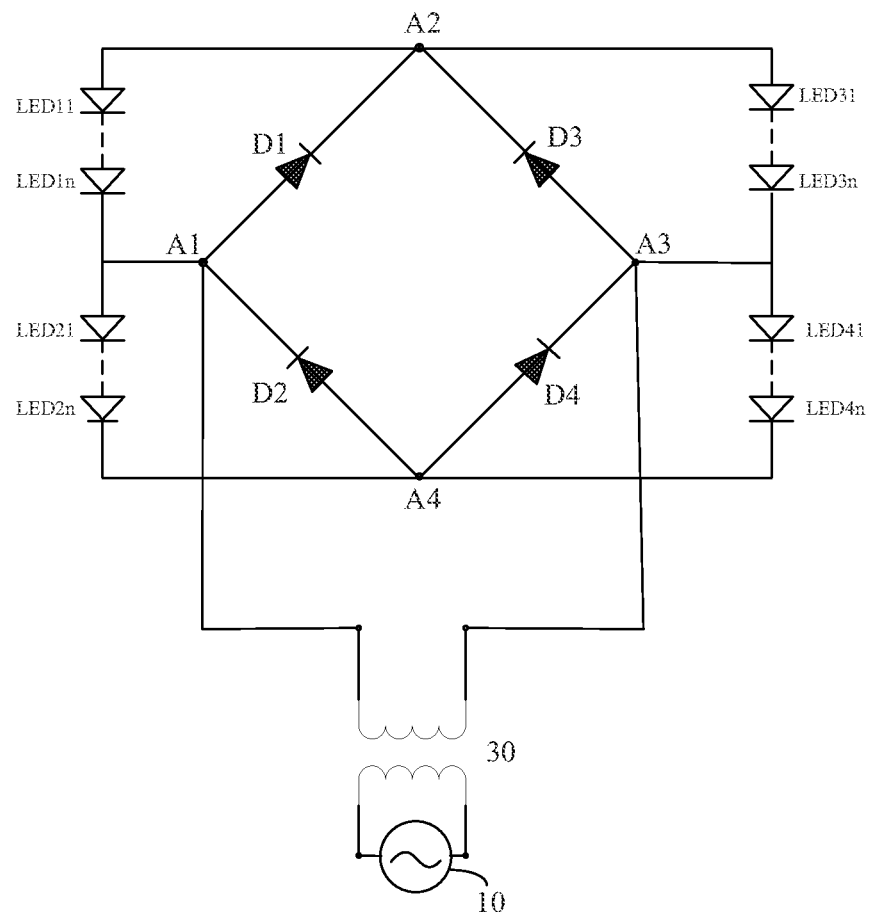
FIG. 1 illustrates a schematic diagram of a lighting circuit according to one embodiment of the present disclosure.

FIG. 1 illustrates a schematic diagram of a lighting circuit according to one embodiment of the present disclosure. Referring FIG. 1, a lighting circuit may include: a first rectifier diode D1, a second rectifier diode D2, a third rectifier diode D3 and a fourth rectifier diode D4, where a positive pole of the first rectifier diode D1 is connected to a negative pole of the second rectifier diode D2, a negative pole of the first rectifier diode D1 is connected to a negative pole of the third rectifier diode D3, a positive pole of the third rectifier diode D3 is connected to a negative pole of the fourth rectifier diode D4, and a positive pole of the fourth rectifier diode D4 is connected to a positive pole of the second rectifier diode D2; and a first set of LEDs including LED11, . . . LED1$n$, a second set of LEDs including LED21, . . . LED2$n$, a third set of LEDs including LED31, . . . LED3$n$, and a fourth set of LEDs including LED41, . . . LED4$n$. The plurality of LEDs of the first set are connected in-series, and the first set of LEDs are connected to the first rectifier diode D1 between its positive and negative poles. The plurality of LEDs of the second set are connected in-series, and the second set of LEDs are connected to the second rectifier diode D2 between its positive and negative poles. The plurality of LEDs of the third set are connected in-series, and the third set of LEDs are connected to the third rectifier diode D3 between its positive and negative poles. The plurality of LEDs of the fourth set are connected in-series, and the fourth set of LEDs are connected to the fourth rectifier diode D4 between its positive and negative poles. In the positive half-wave periods of an AC power, the first rectifier diode D1 and the third set of LEDs which are in a same branch will be powered on and LED31, . . . LED3$n$ will emit light, and the fourth rectifier diode D4 and the second set of LEDs which are in a same branch will be powered on and LED21, . . . LED2$n$ will emit light. In the negative half-wave periods of the AC power, the third rectifier diode D3 and the first set of LEDs which are in a same branch will be powered on and LED11, . . . LED1$n$ will emit light, and the second rectifier diode D2 and the fourth set of LEDs which are in a same branch will be powered on and LED41, . . . LED4$n$ will emit light.

Specifically, the lighting circuit of the present disclosure may include four connecting nodes, respectively, a first node A1, a second node A2, a third node A3 and a fourth node A4. The first rectifier diode D1 is connected between the nodes A1 and A2 with its positive pole connected to A1 and its negative pole connected to A2. The second rectifier diode D2 is connected between the nodes A1 and A4 with its positive pole connected to A4 and its negative pole connected to A1. The third rectifier diode D3 is connected between the nodes A2 and A3 with its positive pole connected to A3 and its negative pole connected to A2. The fourth rectifier diode D4 is connected between the nodes A3 and A4 with its positive pole connected to A4 and its negative pole connected to A3. The first set of LEDs is connected between the nodes A1 and A2, where the positive pole of LED11 is connected to A2, and the negative pole of LED1$n$ is connected to A1. The second set of LEDs is connected between the nodes A1 and A4, where the positive pole of LED21 is connected to A1, and the negative pole of LED2$n$ is connected to A4. The third set of LEDs is connected between the nodes A2 and A3, where the positive pole of LED31 is connected to A2, and the negative pole of LED3$n$ is connected to A3. The fourth set of LEDs is connected between the nodes A3 and A4, where the positive pole of LED41 is connected to A3, and the negative pole of LED4$n$ is connected to A4.

In summary, the second and third sets of LEDs may emit light in the positive half-wave periods of the AC power, and the first and fourth sets of LEDs may emit light in the negative half-wave periods of the AC power. Therefore, the lighting circuit can emit light without a special rectifier circuit to convert an alternating current into a direct current. During a duty cycle of the AC power, each LED works in a half-wave period and does not work in the other half-wave period. Thus, working time of each LED can be reduced during the duty cycles of the AC power. As a result, number of usage and risk of damage of each LED can be reduced, and lifetime of the lighting circuit can be extended.

In some embodiments, the number of LEDs in each set of LEDs may be adjusted according to actual requirements. In some embodiments, the lighting circuit may further include a transformer 30, where input terminals of the transformer 30 are connected to two poles of an AC power source 10, output terminals of the transformer 30 are respectively connected to the positive poles of the first rectifier diode D1 and the third rectifier diode D3. If voltage of an AC power source can not meet the needs of the lighting circuit, a transformer may be used to step-up or step-down the voltage to a desired value, which depends on the number of LEDs. A step-down transformer may be employed if there are less LEDs requiring less voltages, otherwise, a step-up transformer may be employed. The transformer is an optional device. That is, the transformer may not be used if the number of LEDs is appropriate and the AC power source is able to supply a desired voltage level to the lighting circuit.

In some embodiments, the lighting circuit may further include an electrostatic protection circuit (ESD circuit, not shown), which may be connected to the first, second, third and fourth sets of LEDs. The connection mode is known to those skilled in the art, and will not be described in detail herein. In some embodiments, a sapphire substrate may be used. A positive pole and a negative pole are formed on a same surface of the sapphire substrate. The distance between the positive and negative poles is less than 300 μm. Therefore, a self-excited discharge is likely to happen when induced charges accumulate. This may cause a breakdown to an active layer including InGaN/GaN which is typically thin. In this case, an ESD circuit is needed.

In some embodiments, the rectifier diode may be an ordinary silicon diode. The ordinary silicon diode is cheap, thereby decreasing the cost of a lighting circuit. The LED may be selected from a LED emitting blue light, a LED emitting red light, a LED emitting green light and a LED emitting white light. That is, each LED may be one of the above LEDs.

Figure 2:
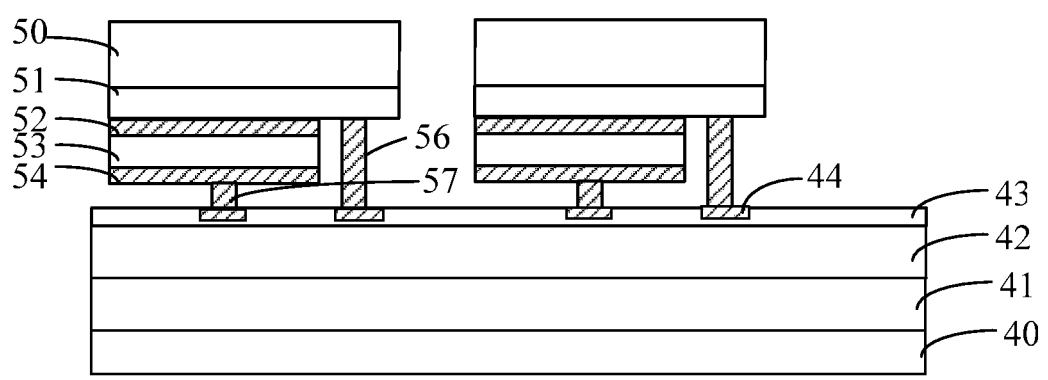
FIG. 2 illustrates a schematic cross-sectional view of an integrated, lighting circuit according to one embodiment of the present disclosure.

FIG. 2 illustrates a schematic cross-sectional view of an integrated lighting circuit according to one embodiment of the present disclosure. Referring to FIG. 2, the lighting circuit is formed on a substrate 40. The substrate 40 may be a silicon substrate, or other types of substrates known in the art, such as aluminium alloy substrate. A cooling layer 41 may be formed on the substrate 40. The cooling layer 41 may be made of copper, aluminium, or other materials known in the art. The cooling layer 41 may dissipate heat generated in the lighting circuit timely, which can avoid damages to the rectifier diodes and LEDs which may be caused by an over heat.

The first rectifier diode D1, the second rectifier diode D2, the third rectifier diode D3 and the fourth rectifier diode D4, and the plurality of LEDs may be formed on the cooling layer 41. Referring to FIGS. 1 and 2, the first rectifier diode D1, the second rectifier diode D2, the third rectifier diode D3 and the fourth rectifier diode D4 may be formed on a first chip layer 42. In some embodiments, the ESD circuit may also be formed on the first chip layer 42 together with the rectifier diodes D1, D2, D3 and D4. In some embodiments, the ESD circuit may not be integrated with the rectifier diodes D1, D2, D3 and D4 on the first chip layer 42 and be formed on another layer. For example, the ESD circuit may be formed on a layer between the cooling layer 41 and the first chip layer 42.

A metal interconnecting line 44 may be formed on the first chip layer 42. The metal interconnecting line 44 may connect the first rectifier diode D1, the second rectifier diode D2, the third rectifier diode D3 and the fourth rectifier diode D4, and the plurality of LEDs according to the way described above. The formation of the metal interconnecting line 44 may include: forming a dielectric layer 43 on the first chip layer 42 which has the first rectifier diode D1, the second rectifier diode D2, the third rectifier diode D3 and the fourth rectifier diode D4 formed thereon; by using a metal interconnecting process in semiconductor technology, photoetching and etching the dielectric layer 43 to form a groove; filling metal, e.g., copper, in the groove to form the metal interconnecting line 44. Alternatively, the formation of the metal interconnecting line 44 may include: forming a metal layer on the first chip layer 42, e.g., an aluminium layer; photoetching and etching the metal layer to remove unnecessary metal, so as to form the metal interconnecting line 44. A dielectric layer 43 may be formed after forming the metal interconnecting line 44, so as to protect the first rectifier diode D1, the second rectifier diode D2, the third rectifier diode D3 and the fourth rectifier diode D4 and the ESD circuit formed on the first chip layer 42. In some embodiments, the dielectric layer 43 may include silicon nitride. In some embodiments, the first rectifier diode D1, the second rectifier diode D2, the third rectifier diode D3 and the fourth rectifier diode D4 and the plurality of LEDs may be connected through a metal interconnecting line in one layer, while the first set of LEDs, the second set of LEDs, the third set of LEDs and the fourth set of LEDs may be connected through a metal interconnecting line in another layer.

The first set of LEDs, the second set of LEDs, the third set of LEDs and the fourth set of LEDs may be formed in a second chip layer (not marked with numeral). In FIG. 2, only two LEDs are illustrated. The four sets of LEDs may be connected through the metal interconnecting line 44 according to the way described above. In some embodiments, the LED may be a LED emitting blue light which is of flip-chip type. The flip-chip LED may include: a sapphire substrate 50, an n-type GaN buffer layer 51, an active layer 52, a p-type GaN cap layer 53 formed successively on the sapphire substrate 50, a contact layer 54 formed on the p-type GaN cap layer 53. The contact layer 54 may include Ni or Au and function as a reflection layer. That is, the light generated from the active layer may be reflected at the contact layer 54, thus light-emitting efficiency can be improved. A portion of the n-type GaN buffer layer 51 overlaps with the active layer 52 and the cap layer 53. In some embodiments, the active layer 52 may be an InGaN multi-quantum well active layer. In some embodiments, the active layer 52 may be a single-quantum well active layer. A positive pole 57 of the LED may be formed on the contact layer 54, and a negative pole 56 of the LED may be formed on a portion of the n-type GaN buffer layer 51 which does not overlap with the active layer 52. The positive pole 57 and the negative pole 56 of each LED are connected respectively to the metal interconnecting line 44 by using a packaging technology. That is, through metal interconnecting line 44, each set of LEDs are connected in-series and are respectively connected to a corresponding rectifier diode according to the way described above. Referring to FIG. 1, as for the flip-chip LED, the positive pole of the LED11 is connected to the negative pole of the first rectifier diode D1, the negative pole of the LED1*n* is connected to the positive pole of the first rectifier diode D1; the positive pole of the LED21 is connected to the negative pole of the second rectifier diode D2, the negative pole of the LED2*n* is connected to the positive pole of the second rectifier diode D2; the positive pole of the LED31 is connected to the negative pole of the third rectifier diode D3, the negative pole of the LED3*n* is connected to the positive pole of the third rectifier diode D3; and the positive pole of the LED41 is connected to the negative pole of the fourth rectifier diode D4, the negative pole of the LED4*n* is connected to the positive pole of the fourth rectifier diode D4.

In the embodiments of the present disclosure, the connection mode of the LED is described by taking a flip-chip LED emitting blue light as an example. And the connection mode of the first rectifier diode D1, the second rectifier diode D2, the third rectifier diode D3 and the fourth rectifier diode D4 to the LED is also described in the above embodiments.

The structures of a LED emitting red light and a LED emitting green light are similar to the LED emitting blue light. The difference of the structures between the three LEDs is that the material of layers are changed correspondingly, which is known to those skilled in the art. The connection mode of the flip-chip LED emitting red light, the flip-chip LED emitting green light and the flip-chip LED emitting white light may be concluded according to the embodiments about the flip-chip LED emitting blue light.

In some embodiments, the LED may be an ordinary LED, not a flip-chip LED. The structure of the ordinary LED is different from the flip-chip LED. In this case, the lighting circuit of the present disclosure may be obtained according to the structure of the ordinary LED, the connection mode of the ordinary LED and the connection mode of the ordinary LED with rectifier diodes, which are known to those skilled in the art.

It should be noted that each of the plurality of LEDs described above is a separate diode. In some embodiments, the plurality of LEDs may be connected together, which may not be separated using a laser cutting technique to form separate diodes.

According to the lighting circuit of the present disclosure, the second and third sets of LEDs may emit light in the positive half-wave period, of the AC power, and the first and fourth sets of LEDs may emit light in the negative half-wave period of the AC power. As for the second and third sets of LEDs, even if a LED is damaged and the corresponding set of LEDs can not work, the other set of LEDs can still work in the positive half-wave period of the AC power. As for the first and fourth sets of LEDs, even if a LED is damaged and the corresponding set of LEDs can not work, the other set of LEDs can still work in the negative half-wave period of the AC power. Thus the lifetime of the lighting circuit can be extended. In the event that the second and third sets of LEDs can not work in the positive half-wave period of the AC power, and only the first and/or fourth sets of LEDs work in the negative half-wave period of the AC power, the lighting circuit can illuminate in the positive half-wave period of the AC power, by using afterglow of the first and fourth sets of LEDs, just a low luminance. Therefore, it is also applicable to the place with an undemanding luminance, thereby further extending the lifetime of the lighting circuit.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. A lighting circuit, comprising:
a first rectifier diode, a second rectifier diode, a third rectifier diode and a fourth rectifier diode, where a positive pole of the first rectifier diode is connected to a negative pole of the second rectifier diode, a negative pole of the first rectifier diode is connected to a negative pole of the third rectifier diode, a positive pole of the third rectifier diode is connected to a negative pole of the fourth rectifier diode, and a positive pole of the fourth rectifier diode is connected to a positive pole of the second rectifier diode;

a first set of LEDs, a second set of LEDs, a third set of LEDs and a fourth set of LEDs, where a plurality of LEDs of the first set are connected in series and are connected to the first rectifier diode between its positive and negative poles, a plurality of LEDs of the second set are connected in series and are connected to the second rectifier diode between its positive and negative poles, a plurality of LEDs of the third set are connected in series and are connected to the third rectifier diode between its positive and negative poles, and a plurality of LEDs of the fourth set are connected in series and are connected to the fourth rectifier diode between its positive and negative poles;

wherein in the positive half-wave period of an AC power, the first rectifier diode and the third set of LEDs in a same branch are powered on and the third set of LEDs emit light, and the fourth rectifier diode and the second set of LEDs in a same branch are powered on and the second set of LEDs emit light;

in the negative half-wave period of the AC power, the third rectifier diode and the first set of LEDs in a same branch are powered on and the first set of LEDs emit light, and the second rectifier diode and the fourth set of LEDs in a same branch are powered on and the fourth set of LEDs emit light; and the first rectifier diode, the second rectifier diode, the third rectifier diode and the fourth rectifier diode are integrated on a first chip layer, the plurality of LEDs connected in series are integrated on a second chip layer, and the second chip layer is formed on the first chip layer.

2. The lighting circuit according to claim 1, further comprising a transformer, where input terminals of the transformer are connected to two poles of the AC power, output terminals of the transformer are respectively connected to the positive poles of the first rectifier diode and the third rectifier diode.

3. The lighting circuit according to claim 1, where the LED is selected from a LED emitting blue light, a LED emitting red light, a LED emitting green light and a LED emitting white light.

4. The lighting circuit according to claim 1, further comprising an electrostatic protection circuit which is connected to the first, second, third and fourth sets of LEDs.

5. The lighting circuit according to claim 4, where the electrostatic protection circuit is integrated on the same layer as the first rectifier diode, the second rectifier diode, the third rectifier diode and the fourth rectifier diode.

6. The lighting circuit according to claim 1, wherein the LED is a flip-chip LED or a non-flip-chip LED.

7. The lighting circuit according to claim 1, further comprising a substrate, where the first chip layer is formed on the substrate.

8. The lighting circuit according to claim 7, further comprising a cooling layer, where the first chip layer is formed on the cooling layer, and the cooling layer is formed on the substrate.

9. The lighting circuit according to claim 7, wherein the substrate is a silicon substrate.

* * * * *